United States Patent [19]

Cooperman

[11] Patent Number: 5,577,036
[45] Date of Patent: Nov. 19, 1996

[54] ATM MEMORY WITH REDUCED NOISE TRANSIENT

[75] Inventor: Michael Cooperman, Framingham, Mass.

[73] Assignee: GTE Laboratories Incorporated, Waltham, Mass.

[21] Appl. No.: 447,144

[22] Filed: May 22, 1995

[51] Int. Cl.$^6$ .................................................. G11C 5/02
[52] U.S. Cl. ............................................ 370/60; 370/94.1
[58] Field of Search .......................... 370/60, 60.1, 94.1, 370/94.2, 94.3; 365/214; 395/401, 441, 497.01, 497.02

[56] References Cited

U.S. PATENT DOCUMENTS 5,309,395  5/1994  Dickinson et al. ............... 365/189.04
5,422,838  6/1995  Lin ................................... 365/49

Primary Examiner—Melvin Marcelo
Attorney, Agent, or Firm—James J. Cannon, Jr.; Peter Xiarhos

[57] ABSTRACT

An asynchronous transmission mode (ATM) memory array capable of storing one ATM packet of data is an n x m array of memory locations, each memory location capable of storing one bit. The array has n columns, where n is the number of bits in an ATM cell of data, and m rows, where m is the number of cells in an ATM packet. The memory array has a plurality of input lines, one for each of said n columns, which together receive n bits simultaneously. It also has n ground lines, one for each of said n columns in said array, each ground line connected to one memory location in each of said n columns in its row; such that each ground line carries the current of only one bit, thereby reducing the noise transients.

3 Claims, 2 Drawing Sheets

ATM MEMORY WITH REDUCED NOISE TRANSIENT

BACKGROUND OF THE INVENTION

1. Field of the Invention

This invention pertains generally to the field of ATM switches having memories, and, in particular to the power supply of an ATM memory chip.

2. Description of the Prior Art

Unlike conventional memories, ATM memories are organized in arrays with very wide data busses. The data buss of an ATM memory is typically 424–480 bits, compared to eight bits for a conventional memory. This creates a potential transient problem in an ATM memory that is caused by writing 480 bits at the same time.

FIG. 1 shows a conventional memory arrangement using horizontal power busses. During a write operation, 480 bits are written at the same time. Consequently, the ground line for that row has to carry the transient current of 480 bits. The transient noise voltage at any column is the sum of the IR drops between that column and the ground point. The transient noise voltage reaches a maximum at column 1. This voltage ($V_1$) is:

$$V_1 = IR + 2IR + 3IR + \ldots nIR \quad (1)$$

$$V_1 = (1+2+3 \ldots n)IR \quad (2)$$

where n=480

Equation (2) is an arithmetic series and can be written in closed form. From "Reference Data for Radio Engineers," Fifth Edition on pp. 44–45 we get:

$$\sum_{k=0}^{n-1}(a+kd) = a+(a+d)+(a+2d)\ldots+ \quad (3)$$

$$[a+(n-1)d] = \tfrac{1}{2}n[2a+(n-1)d]$$

for a=0 and d=1, equation (3) simplifies to:

$$\sum_{k=0}^{n-1} +1+2+3+\ldots+(n-1) = 1/2n(n-1) = 1/2n^2 - 1/2n \quad (4)$$

for n>1, equation 4 simplifies to:

$$\sum_{k=0}^{n-1} k = 1/2n^2 \quad (5)$$

substituting equations 4 and 5 into equation 2 we get:

$$V_1 = (\tfrac{1}{2}n^2)IR \quad (6)$$

For n=480, I=0.2 ma and R=0.1Ω we get:

$$V_1 = \tfrac{1}{2}(480)^2(0.2\times10^{-3})(0.1) = 2.304 \text{ volt} \quad (7)$$

Consequently, the transient noise voltage at the farthest column from the ground, is 2.304 volt which is unacceptably large. This transient noise voltage can be reduced by providing an additional ground connection on the right side. However, the resulting transient noise would still be too large and unworkable.

The principal object of the present invention is to provide an ATM chip power supply which drastically reduces voltage transients due to simultaneous switching of wide data busses.

SUMMARY OF THE INVENTION

An asynchronous transmission mode (ATM) memory array capable of storing one ATM packet of data is an n x m array of memory locations, each memory location capable of storing one bit. The array has n columns, where n is the number of bits in an ATM cell of data, and m rows, where m is the number of cells in an ATM packet. The memory array has a plurality of input lines, one for each of said n columns, which together receive n bits simultaneously. It also has n ground lines, one for each of said n columns in said array, each ground line connected to one memory location in each of said n columns in its row; such that each ground line carries the current of only one bit, thereby reducing the noise transients.

DESCRIPTION OF THE PREFERRED EMBODIMENT

Figure 1:
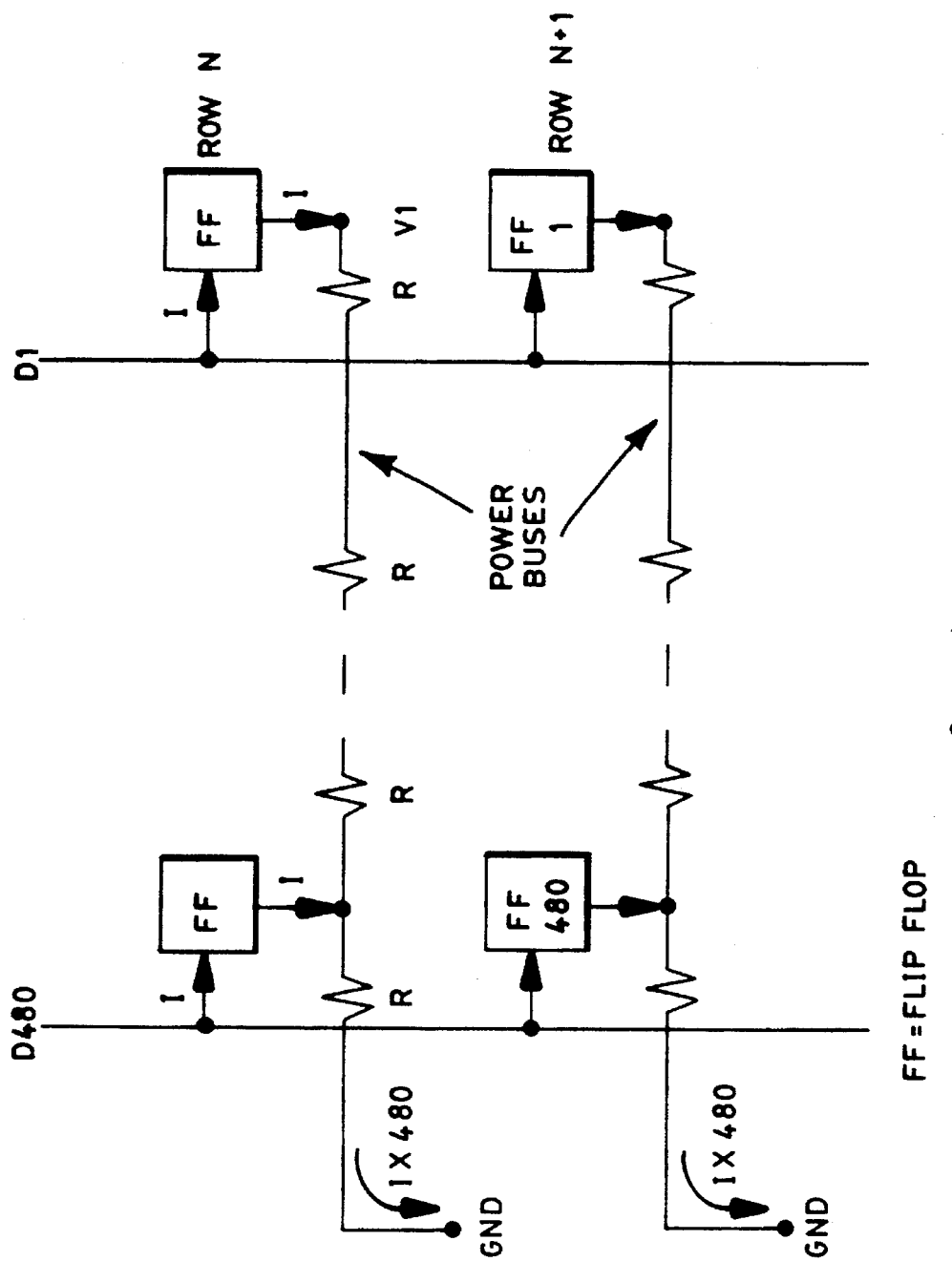
FIG. 1 is a circuit diagram of a prior art conventional memory arrangement using horizontal power busses.
Figure 2:
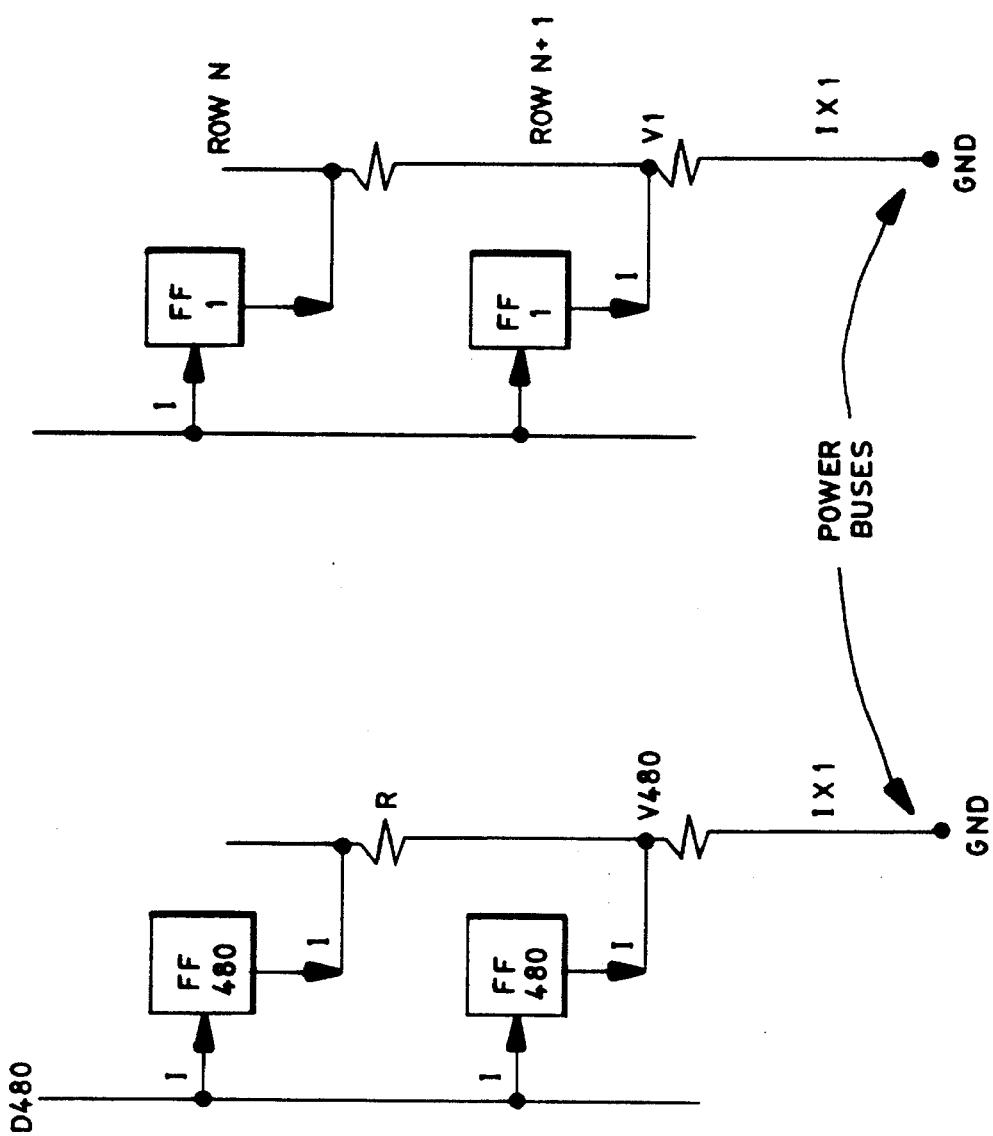
FIG. 2 is a circuit diagram of a memory arrangement using vertical power busses, according to the present invention.

FIG. 2 is a circuit diagram of a memory arrangement using vertical power busses, according to the present invention. The problem of unacceptably large voltage drops in the ground resistance is remedied in the memory chip by using vertical power distribution as shown in FIG. 2.

In the circuit of FIG. 2, an asynchronous transmission mode (ATM) memory array capable of storing one ATM packet of data is an n×m array of memory locations, each memory location capable of storing one bit. The array has n columns, where n is the number of bits in an ATM cell of data, and m rows, where m is the number of cells in an ATM packet. The memory array has a plurality of input lines, one for each of said n columns, which together receive n bits simultaneously. It also has n ground lines, one for each of said n columns in said array, each ground line connected to one memory location in each of said n columns in its row. Since we write to only one row at a time, each ground line carries the current of only one bit, thereby reducing the noise transients.

Using a transient of 0.2 mA/cell and a resistance of 0.1Ω/bit results in a total transient voltage of 0.2 mA×(0.1Ω×64 rows)=1.28 mvolt.

This comparison is not completely fair, since in horizontal distribution we assumed a total of sixty-four grounds vs. 480 grounds for the vertical distribution. In addition, the aspect ratio of the memory cell is such that the resistance in the vertical direction is twice that in the horizontal direction. Correcting for these factors, results in a transient of 19.2 mvolt for vertical power bussing vs. 2.3 volt transients for horizontal power bussing. This results in a major reduction in transient noise voltage compared to horizontal power busses. Consequently the memory circuit arrangement of the present invention is advantageous for a highly parallel memory.

I claim:

1. An asynchronous transmission mode (ATM) memory array capable of storing one ATM packet of data, having reduced noise transients, comprising:

an n×m array of memory locations, each memory location capable of storing one bit;

said array having n columns, where n is the number of bits in an ATM cell of data;

said array having m rows, where m is the number of cells in an ATM packet;

said memory array having a plurality of input lines, one for each of said n columns, which receive n bits simultaneously;

n ground lines, one for each of said n columns in said array, each ground line connected to one memory location in each of said m rows in its column; such that each ground line carries the current of only one bit.

2. The ATM memory array of claim 1 wherein $400<n<500$.

3. The ATM memory array of claim 1 wherein $1<m<65$.

* * * * *